(12) United States Patent
Perisetty et al.

(10) Patent No.: US 7,990,664 B1
(45) Date of Patent: Aug. 2, 2011

(54) ELECTROSTATIC DISCHARGE PROTECTION IN A FIELD PROGRAMMABLE GATE ARRAY

(75) Inventors: Srinivas Perisetty, Santa Clara, CA (US); Antonio Gallerano, Redwood City, CA (US); Jeffrey T. Watt, Palo Alto, CA (US); Cheng-Hsiung Huang, Cupertino, CA (US)

(73) Assignee: Altera Corporation, San Jose, CA (US)

( * ) Notice: Subject to any disclaimer, the term of this patent is extended or adjusted under 35 U.S.C. 154(b) by 325 days.

(21) Appl. No.: 11/639,792

(22) Filed: Dec. 14, 2006

(51) Int. Cl.
*H02H 9/00* (2006.01)
*H02H 3/22* (2006.01)
(52) U.S. Cl. .......................... 361/56; 361/111
(58) Field of Classification Search .................... 361/56, 361/111
See application file for complete search history.

(56) References Cited

U.S. PATENT DOCUMENTS

| | | | | |
|---|---|---|---|---|
| 5,859,758 A | * | 1/1999 | Kim | 361/111 |
| 6,552,879 B2 | * | 4/2003 | Voldman | 360/323 |
| 7,446,378 B2 | * | 11/2008 | Bakker | 257/355 |
| 2007/0058307 A1 | * | 3/2007 | Mergens et al. | 361/56 |

* cited by examiner

*Primary Examiner* — Jared Fureman
*Assistant Examiner* — Lucy Thomas
(74) *Attorney, Agent, or Firm* — Ward and Olivo LLP

(57) ABSTRACT

An ESD protection circuit is integrated into the core of an FPGA in a distributed fashion coupling the bodies of one or more transistors to the power supply pin and/or the ground pin of the FPGA. The ESD protection circuit includes one or more positive discharge paths and one or more negative discharge paths. In the case of a positive ESD event, the positive discharge paths are on and the negative discharge paths are off. In the case of a negative ESD event, the positive discharge paths are off and the negative discharge paths are on. In either event, the bodies of the transistors track the voltages at the power supply pin and/or the ground pin to protect the core from being by damaged by electrostatic discharge.

21 Claims, 11 Drawing Sheets

ELECTROSTATIC DISCHARGE PROTECTION IN A FIELD PROGRAMMABLE GATE ARRAY

FIELD OF THE INVENTION

This application generally relates to electrostatic discharge (ESD) protection and in particular to circuits integrated into the core of a field programmable gate array (FPGA) for protecting transistors therein.

BACKGROUND OF THE INVENTION

Body biasing is a well-known technique of reducing a transistor's leakage current by decoupling the transistor's source from its body and therefore increasing the transistor's turn-on voltage. But when this technique is applied to transistors within the core of an FPGA, special care needs to be taken to provide sufficient discharge paths for the core transistors in case of an electrostatic discharge (ESD) event. A general discussion of the ESD phenomenon and different models of the discharge phenomenon can be found in A. Amerasekera et al., *ESD in Silicon Integrated Circuits*, 2d ed., Wiley 2002, which is incorporated herein by reference.

Conventionally, a gate-grounded NMOS transistor 100 such as that shown in FIG. 1 is often found in the peripheral region of an FPGA die to provide a discharge path in the case of an ESD event. The NMOS transistor 100 comprises n+ source and drain regions in a p-type substrate and an insulated gate on the substrate. The source, the gate and the substrate are grounded. NMOS transistor 100 contains a parasitic n-p-n bipolar transistor 110 having an emitter that is the source region, a collector that is the drain region and a base that is the substrate. The base/substrate has resistance $R_{sub}$. Unlike the NMOS transistor 100, which is a surface device, this n-p-n bipolar transistor 110 is a body device and can therefore handle large currents if turned on through a phenomenon commonly referred to as "snapback conduction".

Although ESD protection circuits like the one in FIG. 1 may be useful in protecting the die from ESD events happening outside the die according to the human body model (HBM), they are not effective in protecting the die from ESD events occurring inside the die (e.g., at a body-biased transistor according to the charged device model (CDM)). This is, in part, because the resistance of a transmission line between the peripheral ESD circuits and the core of the FGPA is too large, which causes a significant voltage drop along the transmission line. But a simple movement of the ESD protection circuits from the peripheral region into the core could not solve the problem or may even cause new problems. For instance, the ESD protection circuit shown in FIG. 1 requires a large footprint on the die as well as additional components (e.g., a guard ring) to protect adjacent circuitry.

In view of the foregoing, there is a need for ESD protection circuits integrated into the core of an FPGA to protect transistors in the core from internal ESD events.

SUMMARY OF THE INVENTION

In a preferred embodiment of the present invention, an ESD protection circuit is integrated into the core of an FPGA coupling the bodies of one or more transistors to the power supply pin and/or the ground pin of the FPGA. The ESD protection circuit includes one or more positive discharge paths and one or more negative discharge paths. In case of a positive ESD event, the positive discharge paths are on and the negative discharge paths are off. In case of a negative ESD event, the positive discharge paths are off and the negative discharge paths are on. In either case, the bodies of the transistors track the voltages at the power supply pin and/or the ground pin to protect the transistors in the core from being by damaged by electrostatic discharge.

BRIEF DESCRIPTION OF THE DRAWINGS

These and other objects, features and advantages of the present invention will be more readily apparent from the following Detailed Description in which.

DETAILED DESCRIPTION

Figure 2A:
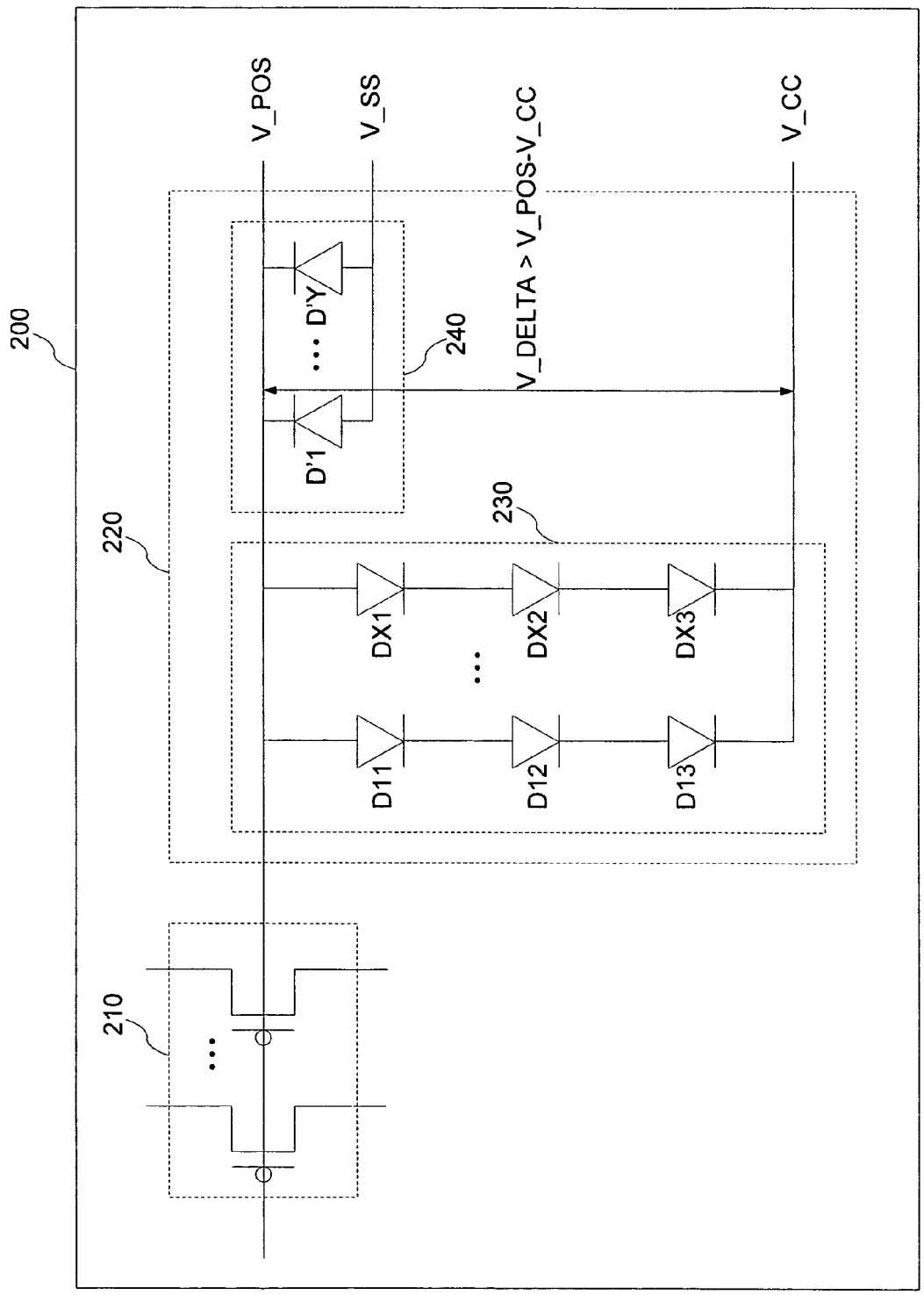
FIG. 2A illustrates an ESD protection circuit for PMOS transistors in a core of an FPGA according to some embodiments of the present invention.
Figure 2B:
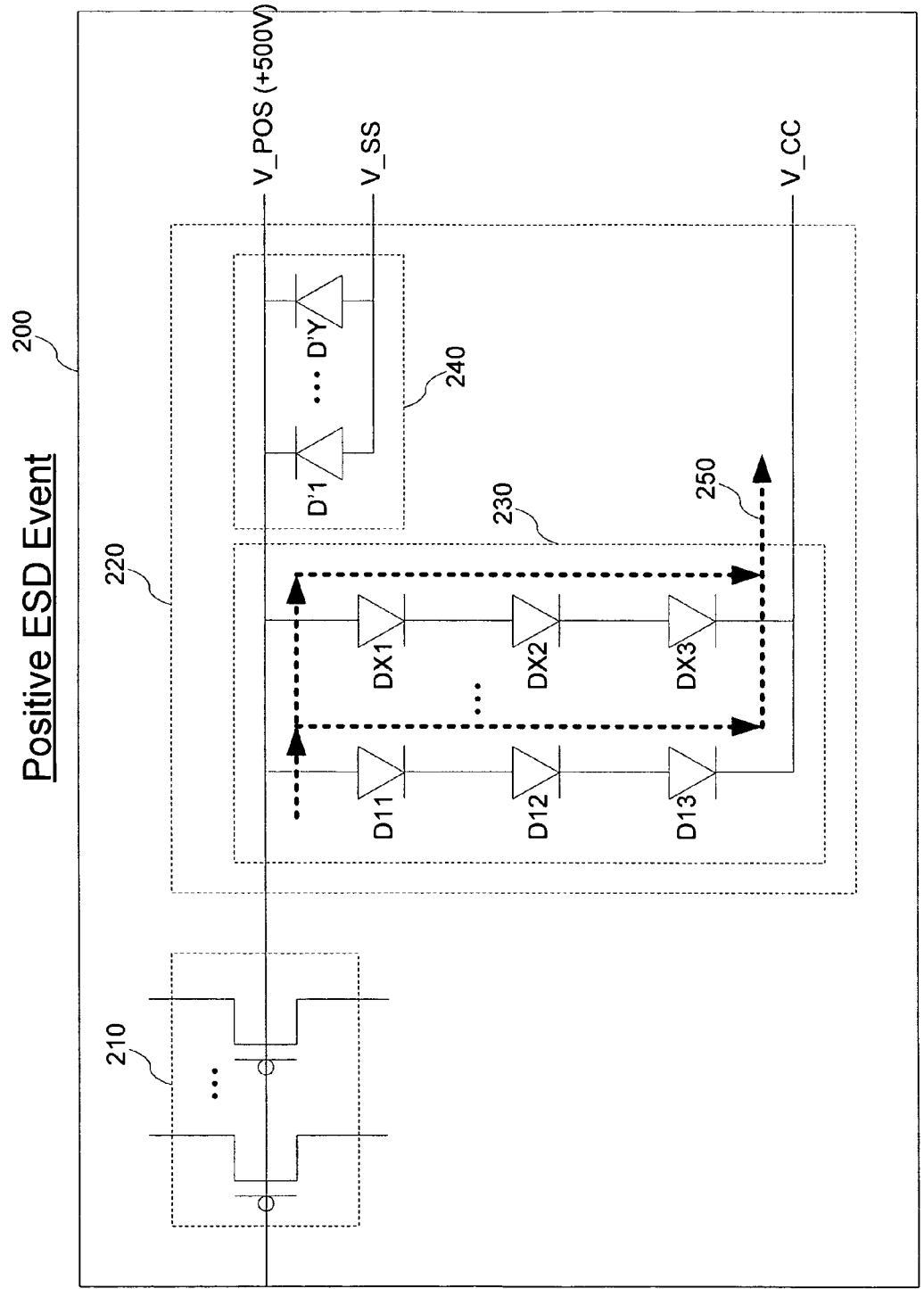
FIG. 2B illustrates the discharge paths of the ESD protection circuit in FIG. 1A in the case of a positive ESD event.
Figure 2C:
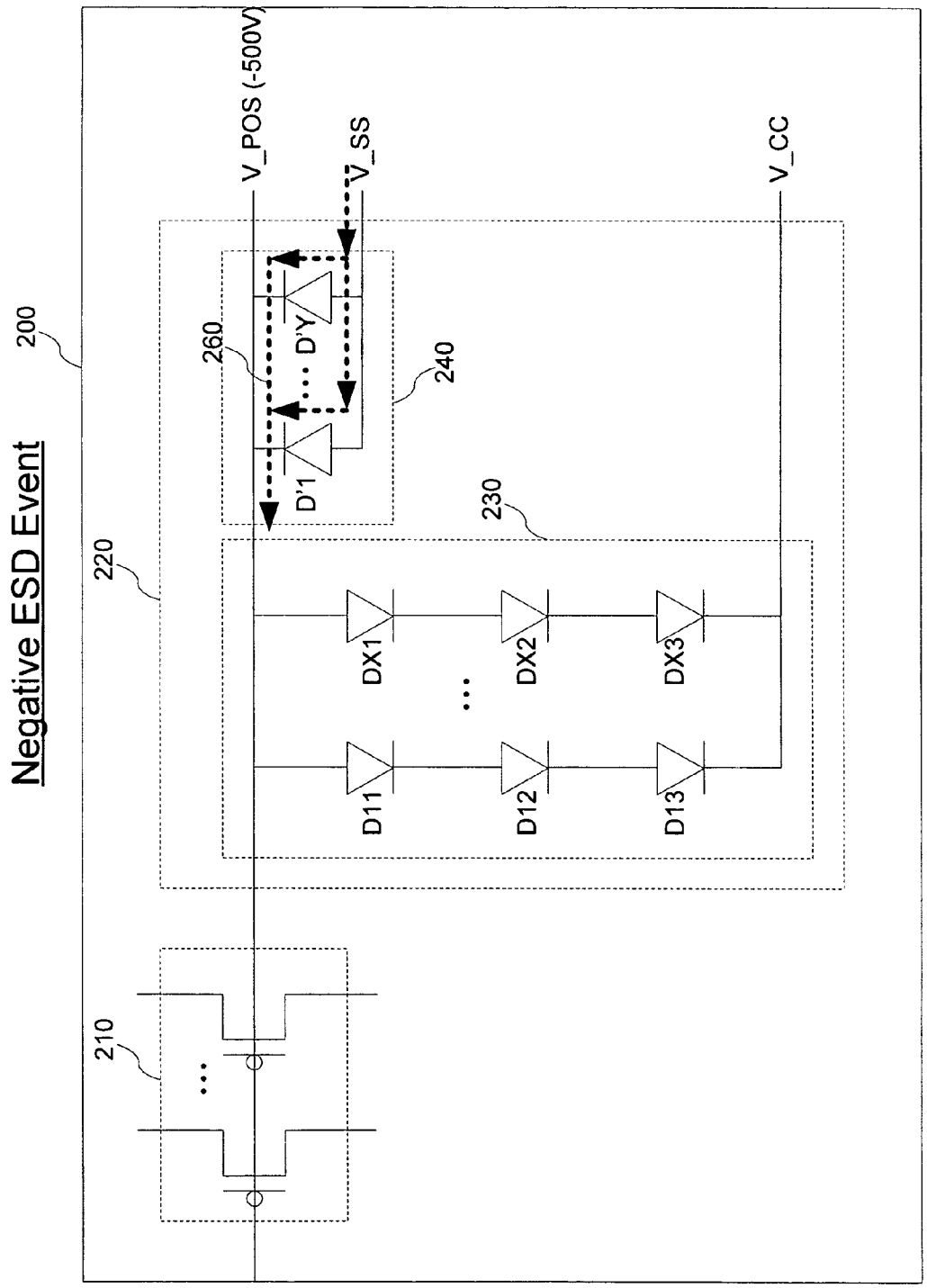
FIG. 2C illustrates the discharge paths of the ESD protection circuit in FIG. 1A in the case of a negative ESD event.
Figure 2D:
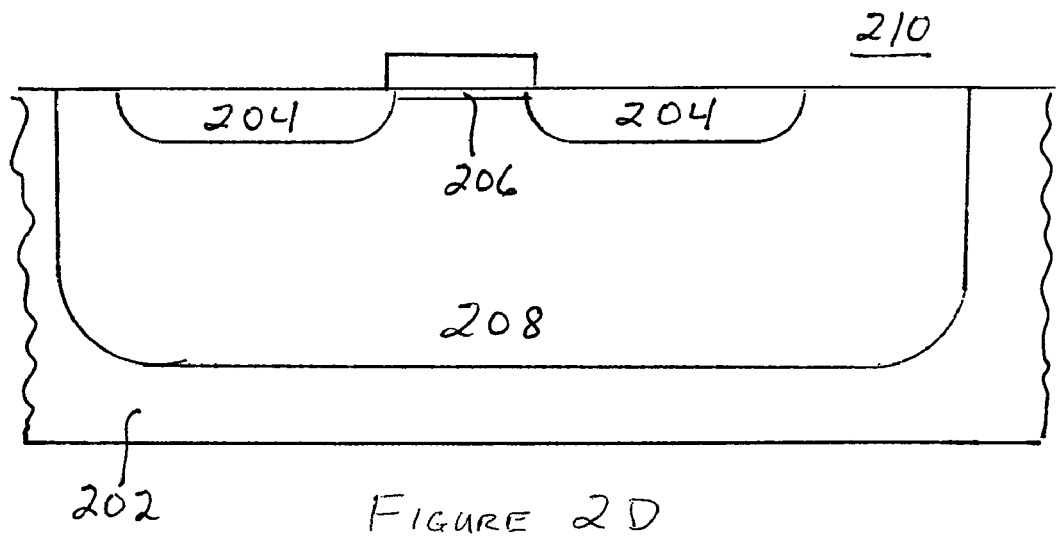
FIG. 2D is a cross-section of a PMOS transistor.
Figure 4D:
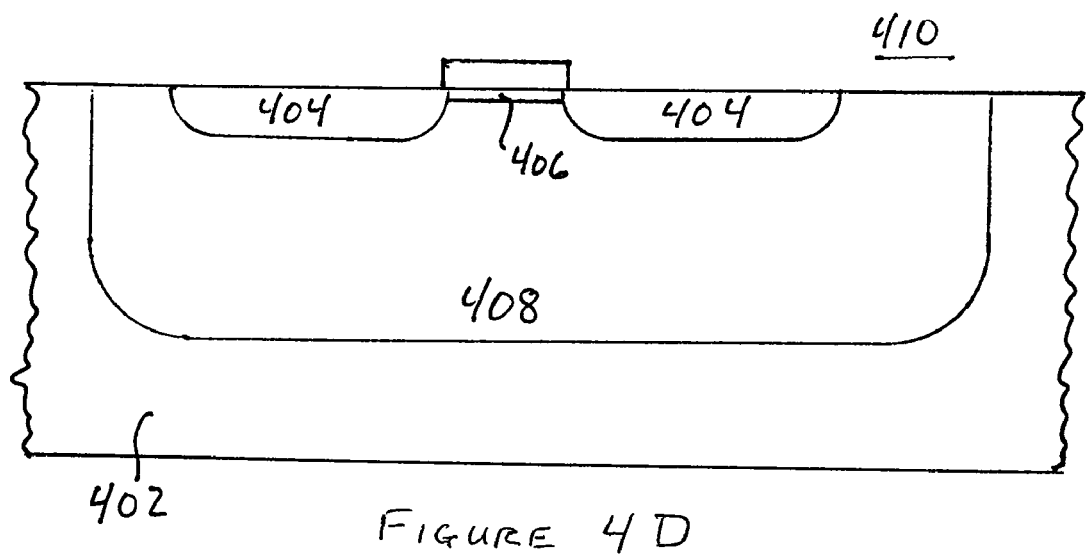
FIG. 4D is a cross-section of a NMOS transistor.

FIG. 2D illustrates the 3-D physical structure of a PMOS transistor 210, which is formed on the surface of a silicon substrate/bulk 202. The transistor 210 includes an n+ body 208 (also known as "n-well") and two p+ regions 204 within the n+ body 208. The two p+ regions 204 are separated by a p-channel 206. The silicon substrate 202 is usually coupled to the ground.

To reduce the transistor 210's leakage current, its body 208 is decoupled from its source and connected to a bias voltage higher than the source voltage (V_CC). A back bias at the p-n junction between the body 208 and the source increases the transistor's threshold voltage V_T and therefore reduces the leakage current. But a problem with this configuration is that it does not provide a discharge path if a CDM ESD event happens at the body 208 of the transistor 210.

To effectively prevent CDM ESD events from damaging the transistor 210, a protection circuit is needed to provide a discharge path for the body 208. This circuit should be free of the shortcomings associated with the snapback-based ESD protection circuit. For example, it can be easily deployed in the core of the FPGA to avoid the large resistance associated with the long transmission line. Moreover, it should have a smaller footprint on the die than the circuit shown in FIG. 1 in order to leave more space for other components on the die (e.g., logic elements).

FIG. 2A illustrates an ESD protection circuit 220 for PMOS transistors 210 in the core 200 of an FPGA die according to some embodiments of the present invention. Unlike the conventional snapback-based ESD protection circuit, this protection circuit is integrated into the core 200. The circuit 220 includes one or more positive discharge paths 230 and one or more negative discharge paths 240. In particular, a positive discharge path comprises a set of serially-connected diodes (e.g., DX1, DX2, and DX3). The anode of the serially-connected diodes is coupled to the bodies 208 of the PMOS transistors 210 being protected, which have a positive bias voltage V_POS to reduce leakage currents in the transistors 210. The cathode of the serially-connected diodes is coupled to a power supply pin having a voltage V_CC. A negative discharge path is comprised of a single diode (e.g., D'Y). The cathode of the diode is coupled to the bodies 208 of the PMOS transistors 210 and the anode of the diode is coupled to a ground pin having a voltage V_SS.

If the FPGA including the PMOS transistors 210 operates under normal conditions, both the positive and negative discharge paths of the ESD protection circuit are off. The number of serially-connected diodes in a positive discharge path 230 depends on the voltage difference between V_POS and V_CC. In one embodiment, V_POS=2.1V and V_CC=1V. If the turn-on voltage of a diode is about 0.5V, there should be at least three diodes in the diode chain with a voltage drop of 1.5V to prevent the positive discharge path from being turned on when the FPGA operates under normal conditions.

On the other hand, too many diodes in the positive discharge path could cause a large voltage drop at the positive discharge path when the discharge path is turned on during a positive ESD event. If this large voltage build-up is more than 4 to 5V, it may damage the PMOS transistors 210. Therefore, the voltage build-up along the diode chain V_DELTA should be larger than the difference between V_POS and V_CC and smaller than 4 to 5V. The number of the diode chains serving as positive discharge paths 230 depends on the number of PMOS transistors to be discharged and the parasitic capacitance of the die in the case of an ESD event. This number can be determined through a numerical and/or an experimental simulation.

In the same embodiment, a negative discharge path has only one diode. Under normal operating conditions, since V_SS=0V and V_POS=2.1V, the diode is reverse biased and the negative discharge path is always off. The diode is forward biased and therefore on when there is a negative ESD event at the bodies of the PMOS transistors 210. Like the positive discharge paths, the number of diodes in the negative discharge paths 240 depends on the amount of negative charges accumulated at the bodies of the PMOS transistors 210.

FIG. 2B depicts how the positive discharge paths 230 in the ESD protection circuit 220 work in the case of a positive ESD event. Illustratively, the bodies 208 of the PMOS transistors 210 are charged up to a high positive voltage (e.g., 500V) in a positive CDM ESD event.

Next, the power supply pin is grounded and V_CC drops from about 500V to nearly 0V. As a result, the large amount of positive charge 250 stored in the bodies is going to be released through the positive discharge paths 230. As shown in FIG. 2B, a forward bias of 500V between V_POS and V_CC quickly turns on all the diode chains to release the positive charge 250 accumulated at the bodies of the PMOS transistors 210. Since the diode chains have a very low (if not zero) on-resistance, V_POS immediately tracks V_CC and drops to nearly 1.5V. In general, the positive charges 250 are released through the active discharge paths 230. Therefore, an instantaneous high voltage at the bodies of the PMOS transistors would not damage the core 200 or the negative discharge paths 240.

FIG. 2C depicts how the ESD protection circuit 220 operates in case of a negative ESD event. This time, the bodies of the PMOS transistors are charged down to a low negative voltage (e.g., −500V) in a negative CDM ESD event.

Next, the ground pin is grounded and V_SS jumps from about −500V to 0V. A forward bias of nearly 500V between V_SS and V_POS quickly turns on all the diodes D'1, . . . , D'Y to release the negative charge 260 accumulated at the bodies of the PMOS transistors 210. Since the diodes have a very low (if not zero) on-resistance, V_POS immediately tracks V_SS and jumps to nearly −0.5V. Therefore, an instantaneous low voltage at the bodies of the PMOS transistors would not damage the core 200 or the positive discharge paths 230.

Figure 3:
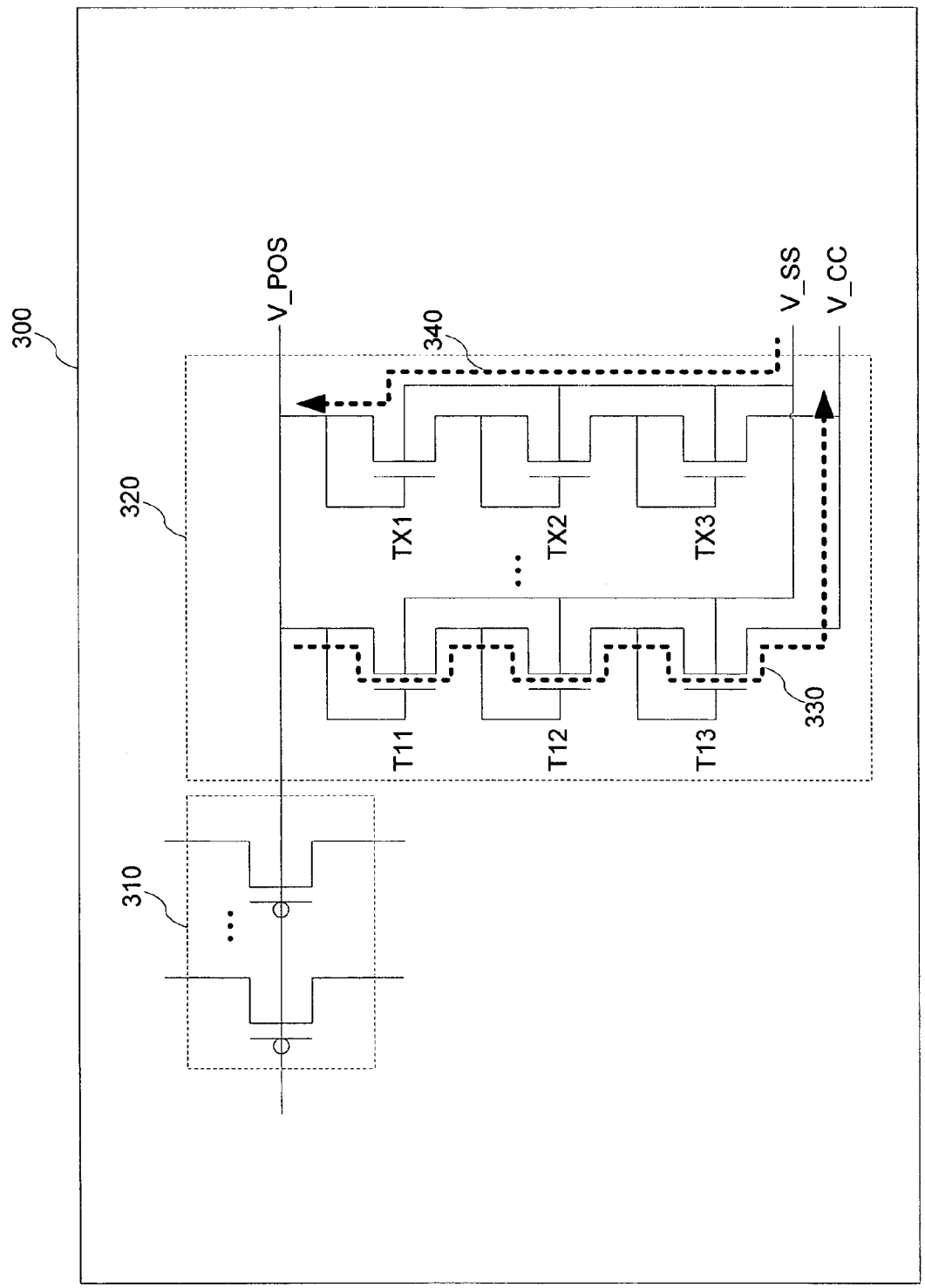
FIG. 3 illustrates another ESD protection circuit for PMOS transistors in a core of an FPGA according to some embodiments of the present invention.

Electronic components like the diodes shown in FIGS. 2A-2C are not the only option for releasing the electrostatic charges, positive or negative, from the bodies of the PMOS transistors. FIG. 3 illustrates another ESD protection circuit 320 for PMOS transistors 310 in a core 300 of an FPGA according to some embodiments of the present invention. The ESD protection circuit 320 includes multiple discharge paths. Each discharge path is comprised of a set of serially-connected, diode-configured NMOS transistors (e.g., T11, T12, and T13).

For example, the transistor T11 is turned on when V_POS applied to its gate is higher than the transistor's threshold voltage (e.g., in the case of a positive ESD event). But when V_POS is lower than the threshold voltage (e.g., in the case of a negative ESD event or under normal operating conditions), the transistor T11 is turned off. In other words, a diode-configured NMOS transistor operates like a diode. Therefore, each set of serially-connected, diode-configured NMOS transistors forms a diode chain such that the anode of the diode chain is coupled to the bodies of the PMOS transistors 310 and the cathode of the diode chain is coupled to the power supply pin V_CC. The bodies of the serially-connected, diode-configured NMOS transistors are coupled to the ground pin V_SS.

Figure 1:
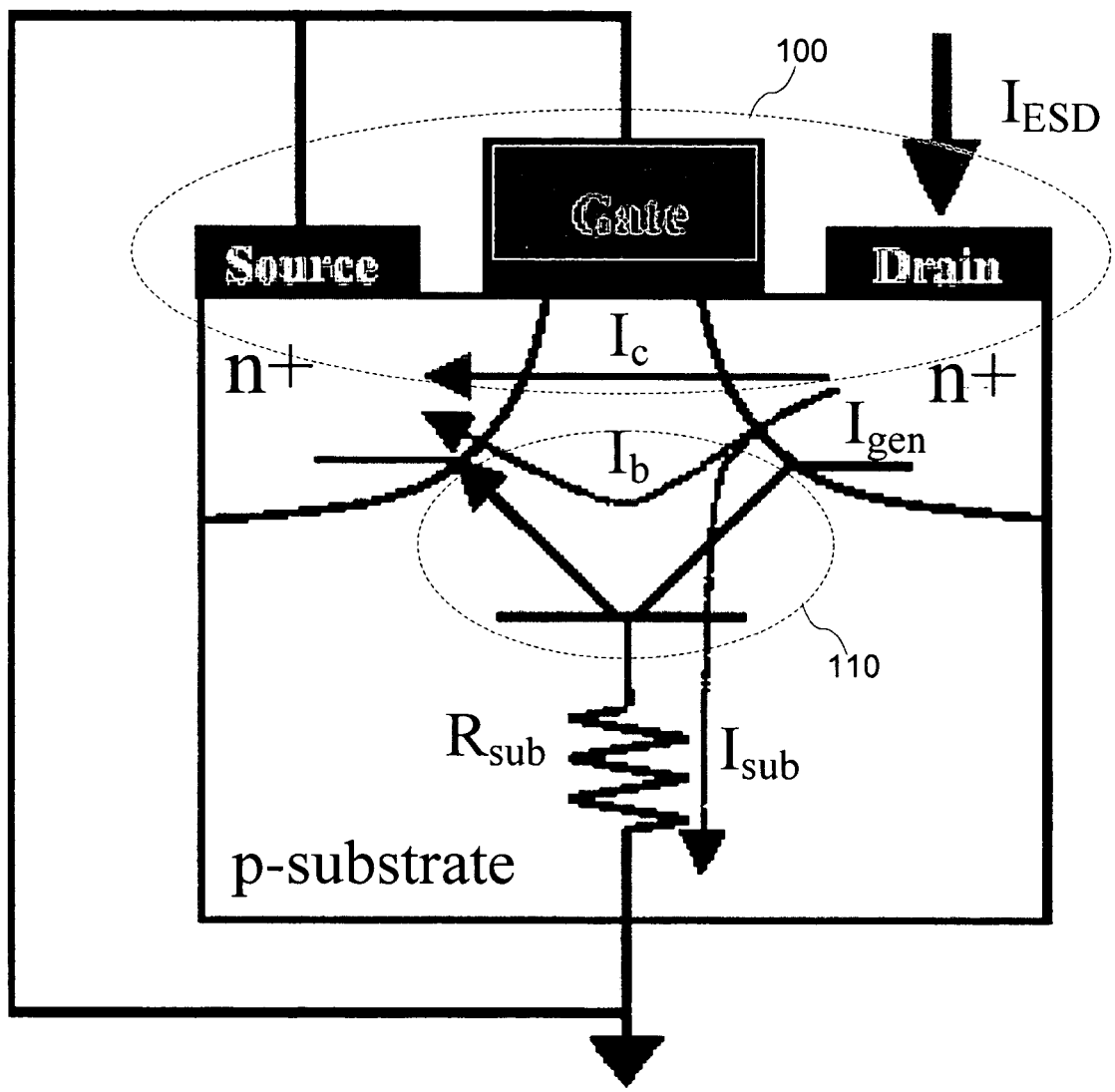
FIG. 1 is a block diagram of a prior art ESD protection circuit.

When there is a positive ESD event at the bodies of the PMOS transistors 310, the high positive voltage V_POS turns on the serially-connected, diode-configured NMOS transistors, which form a positive discharge path 330 to release the positive charges. When there is a negative ESD event at the bodies of the PMOS transistors 310, the low negative voltage V_POS causes all the serially-connected, diode-configured NMOS transistors to be turned off. But as shown in FIG. 1, each NMOS transistor (e.g., TX1) contains a parasitic n-p-n (source-substrate-drain) bipolar transistor. Part of the bipolar transistor is a P-N junction between the ground pin and the bodies of the PMOS transistors. When there is a negative ESD event at the bodies of the PMOS transistors 310, this parasitic P-N junction is forward biased and therefore on, serving as the negative discharge path 340 to release the negative charges.

Figure 4A:
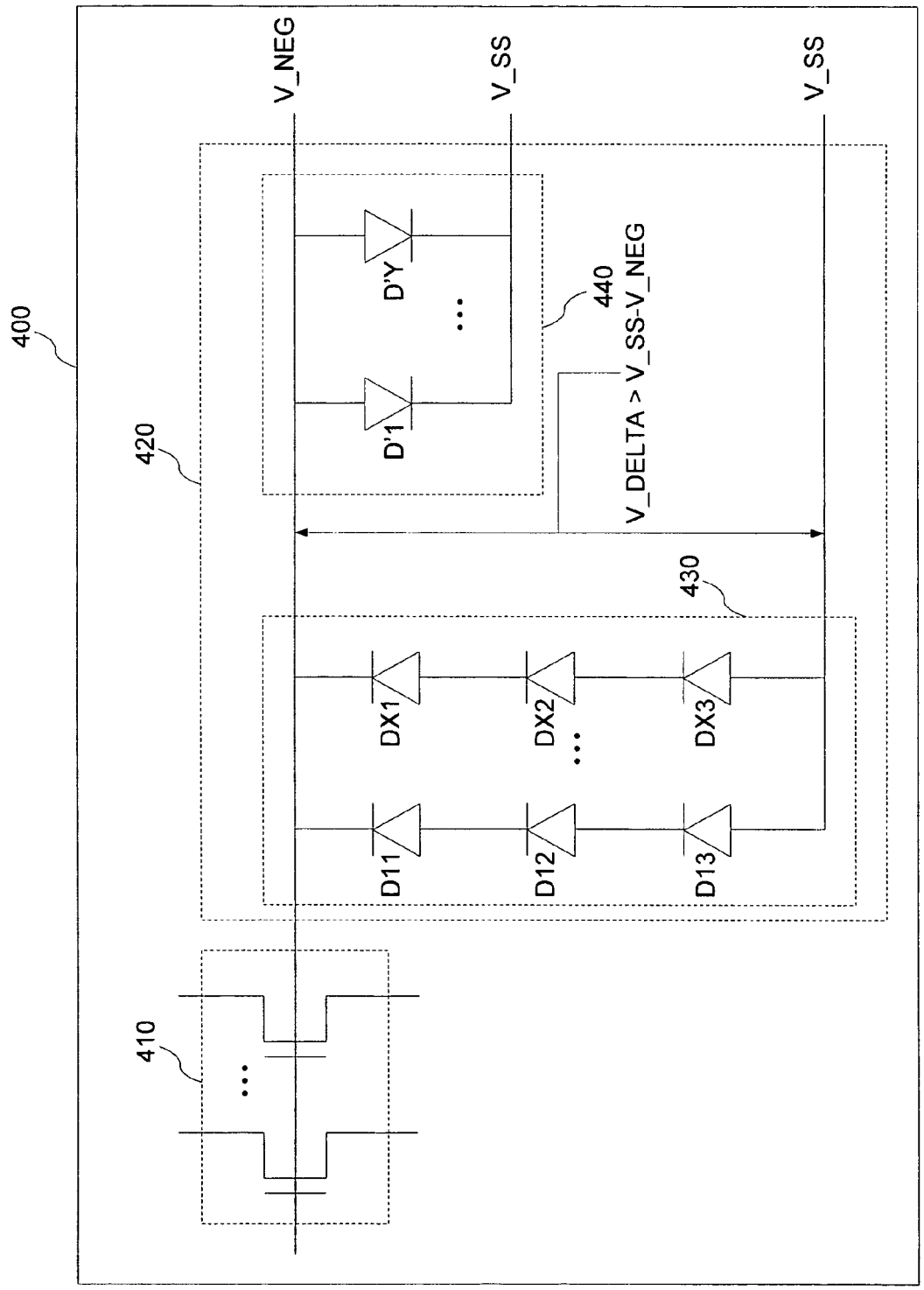
FIG. 4A illustrates an ESD protection circuit for NMOS transistors in a core of an FPGA according to some embodiments of the present invention.
Figure 4B:
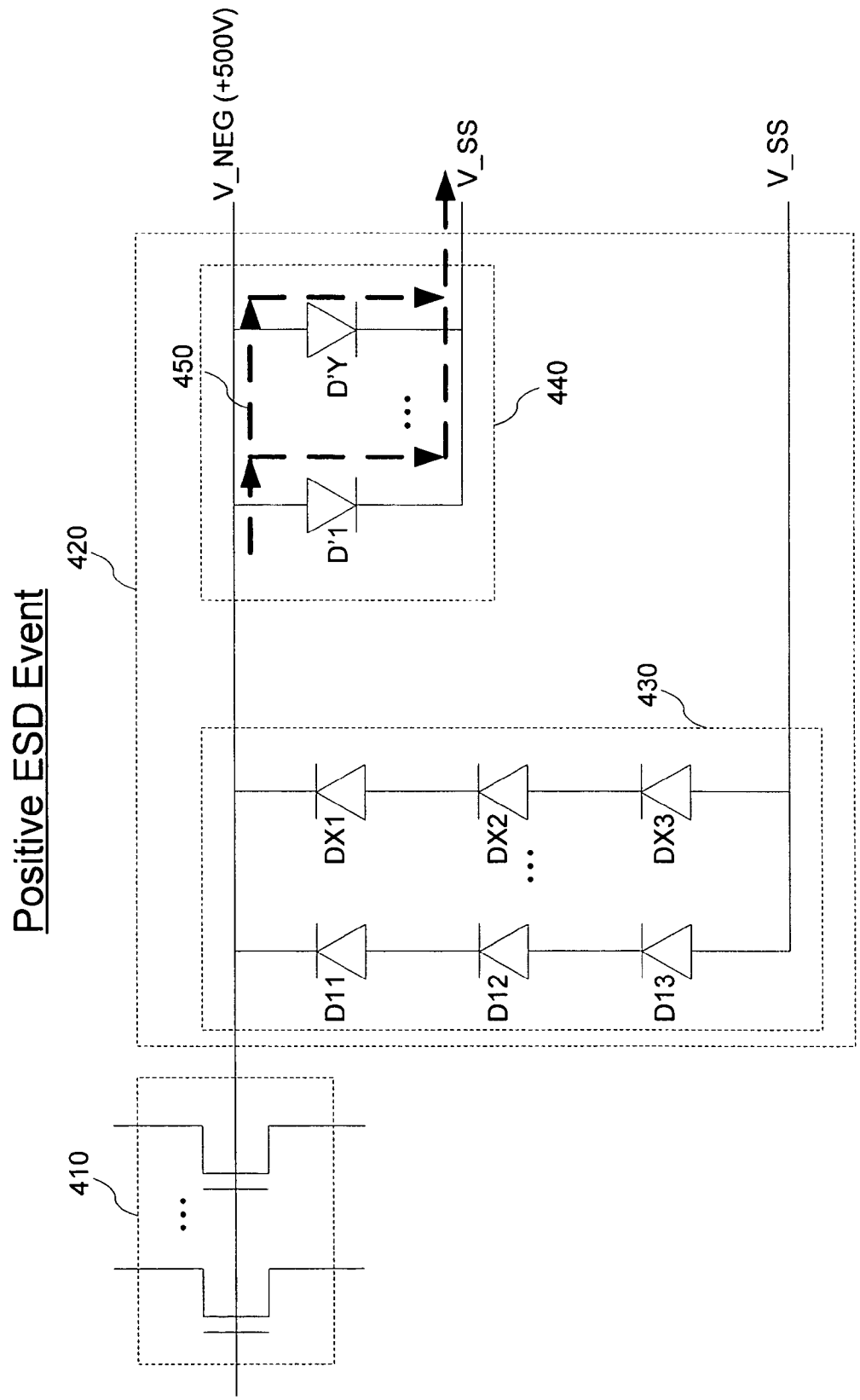
FIG. 4B illustrates the discharge paths of the ESD protection circuit in FIG. 3A in the case of a positive ESD event.
Figure 4C:
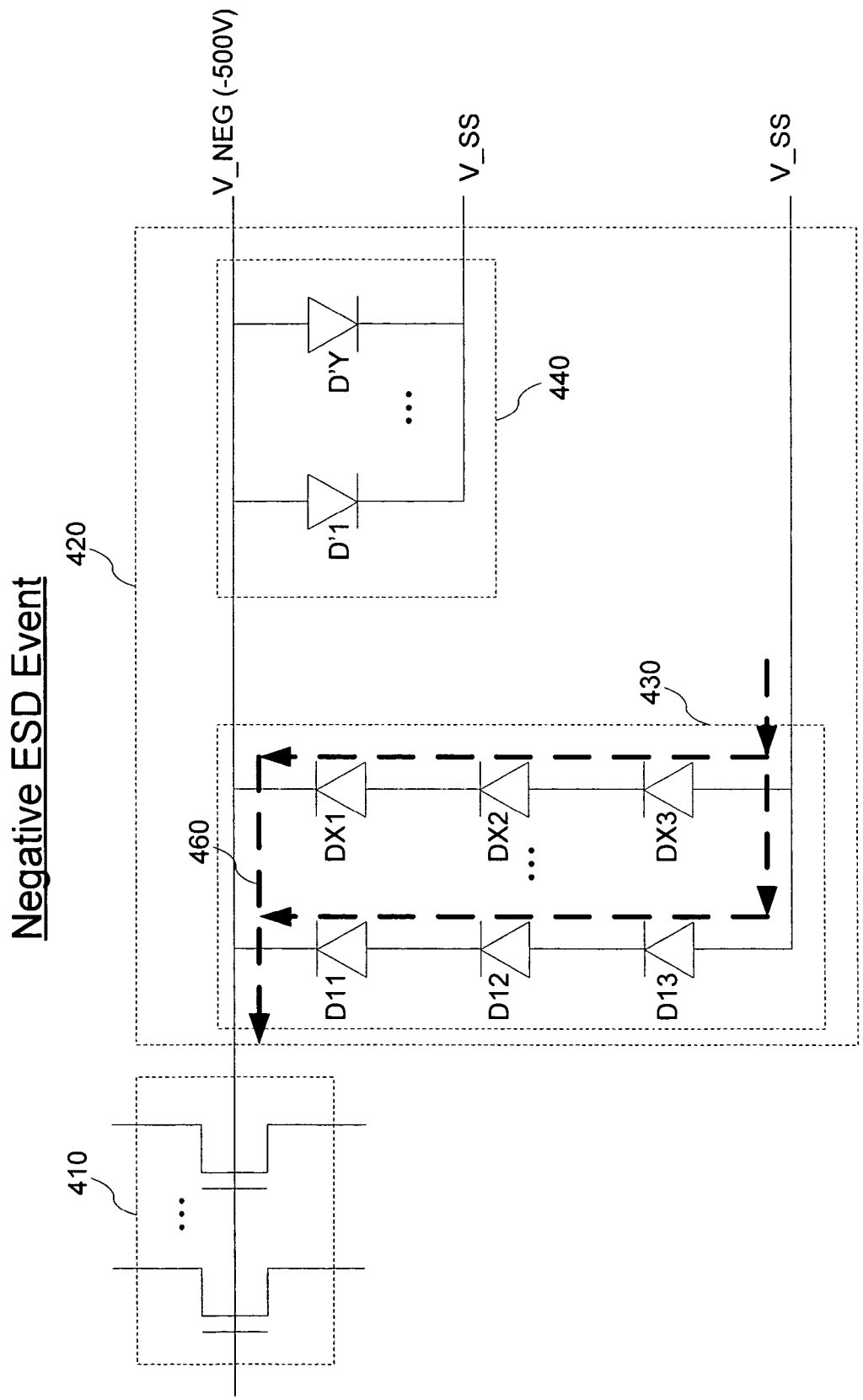
FIG. 4C illustrates the discharge paths of the ESD protection circuit in FIG. 3A in the case of a negative ESD event.

FIGS. 4A-4D illustrate an ESD protection circuit 420 coupled to the p+ body (also known as "p-well") of one or more NMOS transistors 410 in the core 400 of an FPGA according to some embodiments of the present invention. Like the ESD protection circuit 220, the protection circuit 420 includes one or more positive discharge paths 440 and one or more negative discharge paths 430, each path comprised of one or more diodes. But in contrast to the ESD protection circuit 220, each positive discharge path 440 of the ESD protection circuit 420 has only one diode and each negative discharge path 430 of the ESD protection circuit 420 has three serially-connected diodes forming a diode chain. This is because a negative voltage V_NEG (e.g., −1V) is applied to the bodies of the NMOS transistors 420 in order to reduce their leakage currents and therefore save more power. The voltage build-up along the diode chain V_DELTA should be larger than the difference between V_SS and V_NEG and smaller than 4 to 5V. Other than this structural difference, the operation of the ESD protection circuit 420 is similar to that of the ESD protection circuit 220 under either a positive ESD event (FIG. 4B) or a negative ESD event (FIG. 4C).

Figure 5:
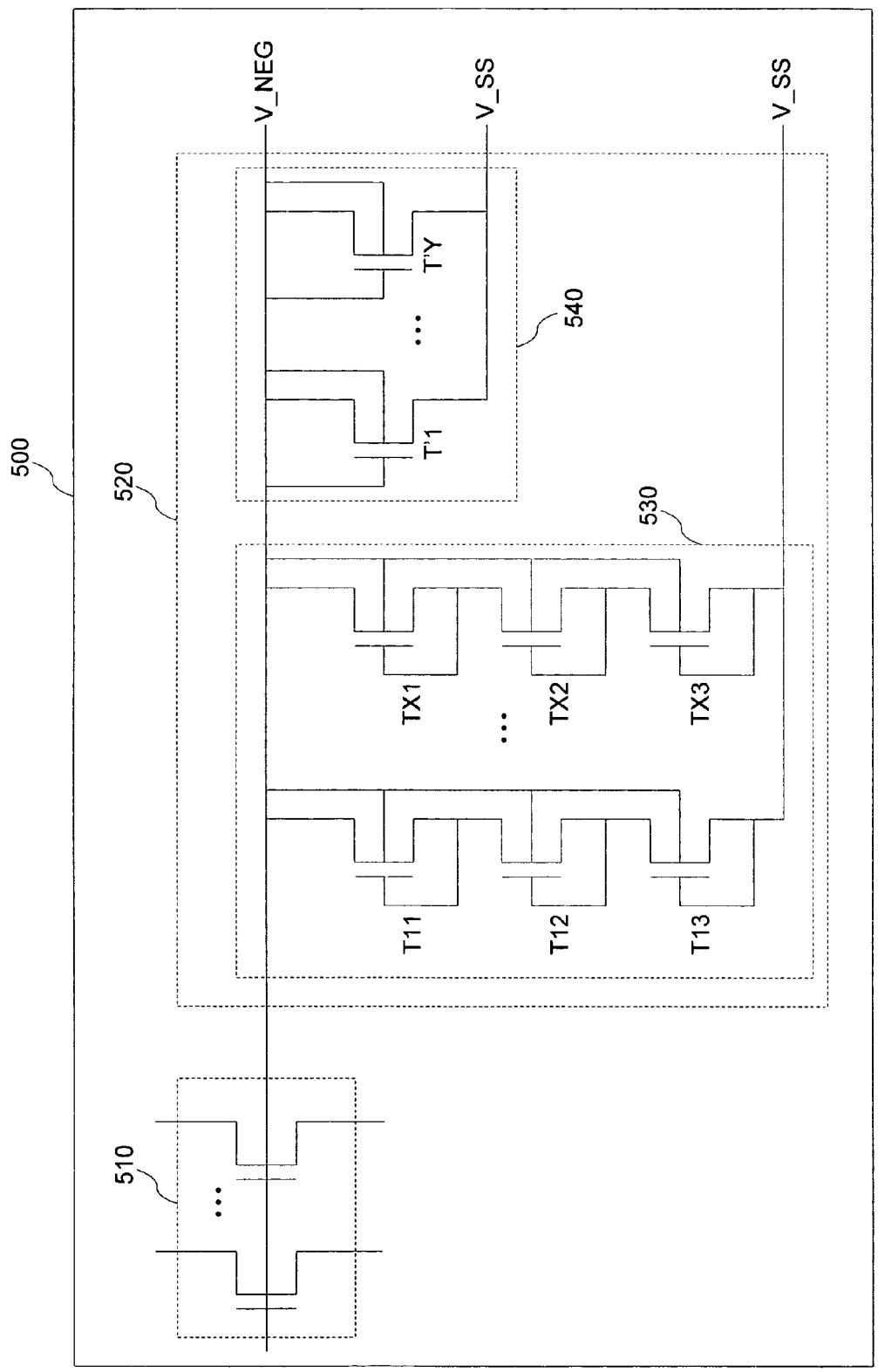
FIG. 5 illustrates another ESD protection circuit for NMOS transistors in a core of an FPGA according to some embodiments of the present invention.

As in the case of the circuits of FIGS. 2A-2D, the diodes in the ESD protection circuit 420 can be replaced by diode-configured NMOS transistors as shown in FIG. 5. In particular, the transistors T'1, . . . , T'Y serve as the positive discharge paths 540 and the serially-connected transistors (e.g., T11, T12, and T13) provide the negative discharge paths 530.

It will be appreciated by those skilled in the art that the operation of the ESD protection circuits 220, 320, 420, 520 does not rely on the "snapback" phenomenon, which is required by the prior art ESD protection circuit shown in FIG. 1. They are therefore free of the shortcomings associated with the prior art ESD protection circuit. In particular, the ESD protection circuits 220, 320, 420, 520 provide active discharge paths for both positive and negative ESD events and they are faster than those snapback-based ESD protection schemes. There is also no need for any protective components such as guard rings since these ESD protection circuits do not interfere with the operation of other circuitry on the same die. As a result, the ESD protection circuits according to the present invention can be integrated into the core of an FPGA in a distributed fashion.

Figure 6:
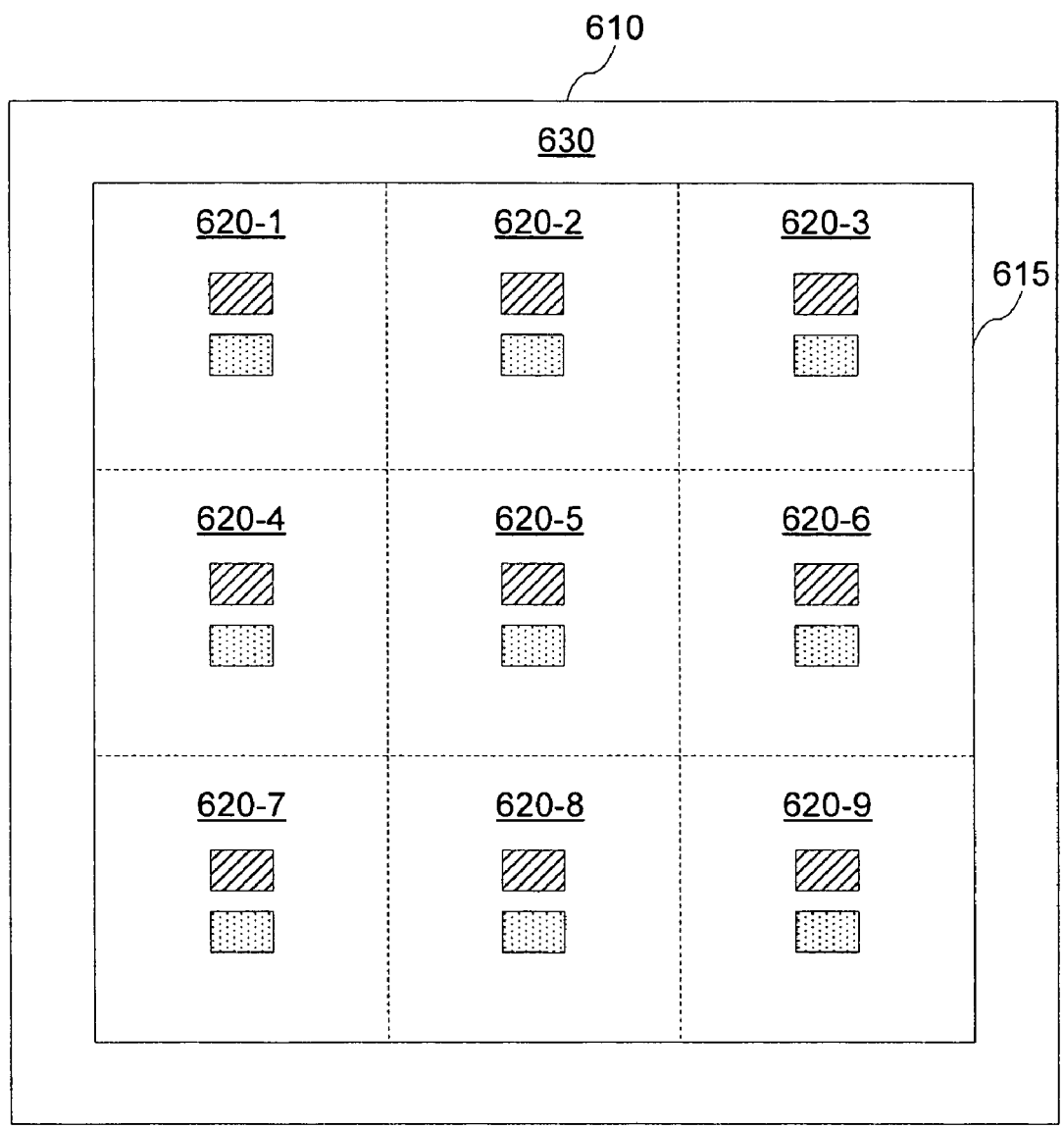
FIG. 6 is a block diagram of an FPGA die including distributed PMOS and NMOS ESD protection circuits according to some embodiments of the present invention.

FIG. 6 is a block diagram of an FPGA die 610 including distributed PMOS and NMOS ESD protection circuits in the central region of the die according to some embodiments of the present invention. For illustrative purposes, the die 610 is divided into the peripheral region 630 and the central region 615. The peripheral region 630 includes I/O circuits 632, power supply circuits and the conventional snapback-based ESD protection circuits, etc.

The central region includes a 2-D array of identical configurable logic block (CLB) modules 620-*n*, each module including a predefined number of logic elements. There is a pair of PMOS and NMOS ESD protection circuits located at the central area of a logic block. These two circuits are configured to protect the MOSFET transistors in the same logic block from CDM ESD events. In some embodiments, the PMOS and NMOS ESD protection circuits at different logic blocks are connected together, forming a CDM ESD protection network on the die 610. In some other embodiments, not every logic block has its own ESD protection circuits. Rather, adjacent logic blocks can share the same ESD protection circuits.

The foregoing description, for purpose of explanation, has been set forth with reference to specific embodiments. However, the illustrative discussions above are not intended to be exhaustive or limit the invention to the precise forms disclosed. For example, those skilled in the art will find that it is possible to have an ESD protection circuits including both diode-configured transistors (NMOS or PMOS) and diodes to take advantage of different types of components. Moreover, the distributed ESD protection network on the die may take other forms obvious to those skilled in the art.

What is claimed is:

1. An electrostatic discharge (ESD) protection circuit for protecting a PMOS transistor, comprising:
    at least two parallel positive discharge paths, each positive discharge path comprising an equal number of diodes coupled in series between a body of the PMOS transistor and a power supply pin; and
    at least two parallel negative discharge paths, each negative discharge path comprising a single diode having its cathode coupled to the body of the PMOS transistor and its anode coupled to a ground pin.

2. The ESD protection circuit of claim 1, wherein the positive discharge paths are on and the negative discharge paths are off in response to a positive ESD event.

3. The ESD protection circuit of claim 2, wherein the body of the PMOS transistor is operable to track the power supply pin through the positive discharge paths in response to the positive ESD event.

4. The ESD protection circuit of claim 1, wherein the positive discharge paths are off and the negative discharge paths are on in response to a negative ESD event.

5. The ESD protection circuit of claim 4, wherein the body of the transistor is operable to track the ground pin through the negative discharge paths in response to the negative ESD event.

6. The ESD protection circuit of claim 1, wherein each positive discharge path includes a predefined number of serially coupled diodes having an anode and cathode that are respectively coupled to the body of the PMOS transistor and the power supply pin, wherein the predefined number of serially coupled diodes in each positive discharge path are such that a sum of the turn on voltages of the diodes exceeds the difference between a bias voltage applied to the body of the PMOS transistor and a voltage applied to the voltage supply pin.

7. The ESD protection circuit of claim 1, wherein each positive discharge path includes a predefined number of serially coupled, diode-configured NMOS transistors having an anode and cathode that are respectively coupled to the body of the PMOS transistor and the power supply pin, and each NMOS transistor directly coupled to the body of the transistor forms one of the negative discharge paths having a cathode and anode that are respectively coupled to the body of the PMOS transistor and the ground pin.

8. The ESD protection circuit of claim 1, wherein the body of the PMOS transistor is an n-well.

9. An electrostatic discharge (ESD) protection circuit for protecting an NMOS transistor, comprising:
    at least two parallel positive discharge paths, each positive discharge path comprising a single diode having its anode coupled to a body of the NMOS transistor and its cathode coupled to a ground pin; and
    at least two parallel negative discharge paths, each negative discharge path comprising an equal number of diodes coupled in series between the body of the NMOS transistor and the ground pin.

10. The ESD protection circuit of claim 9, wherein the positive discharge paths are on and the negative discharge paths are off in response to a positive ESD event.

11. The ESD protection circuit of claim 10, wherein the body of the transistor is operable to track the ground pin through the positive discharge paths in response to the positive ESD event.

12. The ESD protection circuit of claim 9, wherein the positive discharge paths are off and the negative discharge paths are on in response to a negative ESD event.

13. The ESD protection circuit of claim 12, wherein the body of the transistor is operable to track the ground pin through the negative discharge paths in response to the negative ESD event.

14. The ESD protection circuit of claim 9, wherein each negative discharge path includes a predefined number of serially coupled diodes having a cathode and anode that are respectively coupled to the body of the NMOS transistor and the ground pin, wherein the predefined number of serially coupled diodes in each negative discharge path are such that a sum of the turn on voltages of the diodes exceeds the difference between a bias voltage applied to the body of the NMOS transistor and ground.

15. The ESD protection circuit of claim 9, wherein each negative discharge path includes a predefined number of serially coupled, diode-configured NMOS transistors whose cathode and anode are respectively coupled to the body of the NMOS transistor to be protected and the ground pin, and each positive discharge path includes a single diode-configured NMOS transistor whose anode and cathode are respectively coupled to the body of the NMOS transistor to be protected and the ground pin.

16. The ESD protection circuit of claim 9, wherein the body of the NMOS transistor is a p-well.

17. A field programmable gate array (FPGA), comprising:
a central region having a plurality of transistors and one or more ESD protection circuits that include diodes; and
a peripheral region surrounding the central region;
wherein the one or more ESD protection circuits are configured to provide at least two parallel positive discharge paths and at least two parallel negative discharge paths from bodies of the plurality of transistors to a power supply or ground, wherein each positive discharge path has a same number of diodes coupled in series and each negative discharge path has a single diode.

18. The FPGA of claim 17, wherein the central region includes first and second logic block modules, and wherein at least one of the protection circuits is located in a substantially centered area of each of the first and second logic block modules.

19. The FPGA of claim 17, wherein the plurality of transistors includes at least one PMOS transistor, wherein a well of said at least one PMOS transistor is decoupled from its source/drain and wherein the at least one or more ESD protection circuits includes at least one circuit coupled to the well of the PMOS transistor, wherein a discharge path is provided for the PMOS transistor in response to an ESD event.

20. A field programmable gate array (FPGA), comprising:
a central region having a plurality of transistors and one or more ESD protection circuits that include diodes; and
a peripheral region surrounding the central region;
wherein the one or more ESD protection circuits are configured to provide at least two parallel positive discharge paths and at least two parallel negative discharge paths from bodies of the plurality of transistors to a power supply or ground, wherein and each negative discharge path has a same number of diodes coupled in series and each positive discharge path has a single diode.

21. The FPGA of claim 20, wherein the plurality of transistors includes at least one NMOS transistor, wherein a well of said at least one NMOS transistor is decoupled from its source/drain, and wherein the at least one or more ESD protection circuits includes at least one circuit coupled to the well of the NMOS transistor, wherein a discharge path is provided for the NMOS transistor in response to an ESD event.

* * * * *